(12) United States Patent
Choi

(10) Patent No.: US 9,263,127 B1
(45) Date of Patent: Feb. 16, 2016

(54) MEMORY WITH SPECIFIC DRIVING MECHANISM APPLIED ON SOURCE LINE

(71) Applicant: Winbond Electronics Corp., Taichung (TW)

(72) Inventor: Myung Chan (Mickey) Choi, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/458,037

(22) Filed: Aug. 12, 2014

(51) Int. Cl.
*G11C 11/00* (2006.01)
*G11C 13/00* (2006.01)
*G11C 11/56* (2006.01)

(52) U.S. Cl.
CPC ........ *G11C 13/0069* (2013.01); *G11C 13/0002* (2013.01); *G11C 13/0023* (2013.01); *G11C 13/0097* (2013.01); *G11C 11/5678* (2013.01)

(58) Field of Classification Search
CPC ............... H01L 45/14; G11C 13/0069; G11C 13/0002; G11C 13/0004; G11C 11/5678; G11C 13/0021; G11C 2013/009

USPC ........................ 365/148, 163, 189.11, 189.09
See application file for complete search history.

(56) References Cited

U.S. PATENT DOCUMENTS

| 8,179,707 | B2 * | 5/2012 | Song et al. ....................... 365/51 |
| 8,848,421 | B2 * | 9/2014 | Kawai et al. .................. 365/148 |
| 2015/0109849 | A1 * | 4/2015 | Tsai et al. ..................... 365/148 |

* cited by examiner

*Primary Examiner* — David Lam
(74) *Attorney, Agent, or Firm* — Muncy, Geissler, Olds & Lowe, P.C.

(57) ABSTRACT

An embodiment of the invention provides a memory. The memory includes a plurality of word lines, a plurality of bit lines, a plurality of source lines and a memory cell array. The memory cell array has a plurality of memory cells disposed at the intersections of the word and bit lines to form a matrix of rows and columns, wherein each memory cell comprises a resistive memory device and a transistor. The source lines are each disposed between two word lines, wherein each source line is coupled to source terminals of the transistors. When a RESET operation is applied to a selected memory cell, the voltage level of the source line is pulled up to a first voltage level, and when another operation is applied to the selected memory cell, the source line is grounded.

28 Claims, 7 Drawing Sheets

US 9,263,127 B1

MEMORY WITH SPECIFIC DRIVING MECHANISM APPLIED ON SOURCE LINE

BACKGROUND OF THE INVENTION

1. Field of the Invention

The present invention relates to resistance random access memory, and more particularly to a resistance random access memory array structure.

2. Description of the Related Art

With the growth in the use of portable electronic devices, the demand for non-volatile memory has increased. Among the various kinds of non-volatile memory, resistance random access memory is the most competitive next-generation non-volatile memory due to its higher speed, lower power consumption, higher capacity, reliability, easier process integration and lower cost. By inputting specific operation voltage, the character of the material applied to the resistance random access memory (ReRAM) can change quickly between two states. SET and RESET operations are mainly achieved by inputting two different operation voltages to the resistance random access memory to switch the resistance random access between a high resistance state and a low resistance state. Based on the process described above, the logic state of the resistance random access memory can be switched by inputting different operation voltage, enabling data storage.

BRIEF SUMMARY OF THE INVENTION

An embodiment of the invention provides a memory structure. The memory includes a plurality of word lines, a plurality of bit lines, a plurality of source lines and a memory cell array. The memory cell array has a plurality of memory cells disposed at the intersections of the word and bit lines to form a matrix of rows and columns, wherein each memory cell comprises a resistive memory device and a transistor. The source lines are each disposed between two word lines, wherein each source line is coupled to source terminals of the transistors. Each source line is driven by a source line driver, and the source line driver receives a command signal and an address signal, and pulls up the source line to the first voltage level according to the command signal and the address signal. When a RESET operation is applied to a selected memory cell, the voltage level of the source line is pulled up to a first voltage level, and when another operation is applied to the selected memory cell, the source line is grounded.

Another embodiment of the invention provides a memory. The memory includes a plurality of word lines, a plurality of bit lines, a plurality of source lines and a memory cell array. The memory cell array has a plurality of memory cells disposed at the intersections of the word and bit lines to form a matrix of rows and columns, wherein each memory cell comprises a resistive memory device and a transistor. The source lines are disposed in the memory cell array, wherein each source line is shared by two successive word lines. Each source line is driven by a source line driver, and the source line driver receives a command signal and an address signal, and pulls up the source line to the first voltage level according to the command signal and the address signal. When a RESET operation is applied to a selected memory cell, the voltage level of the source line is pulled up to a first voltage level, and when another operation is applied to the selected memory cell, the source line is grounded.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
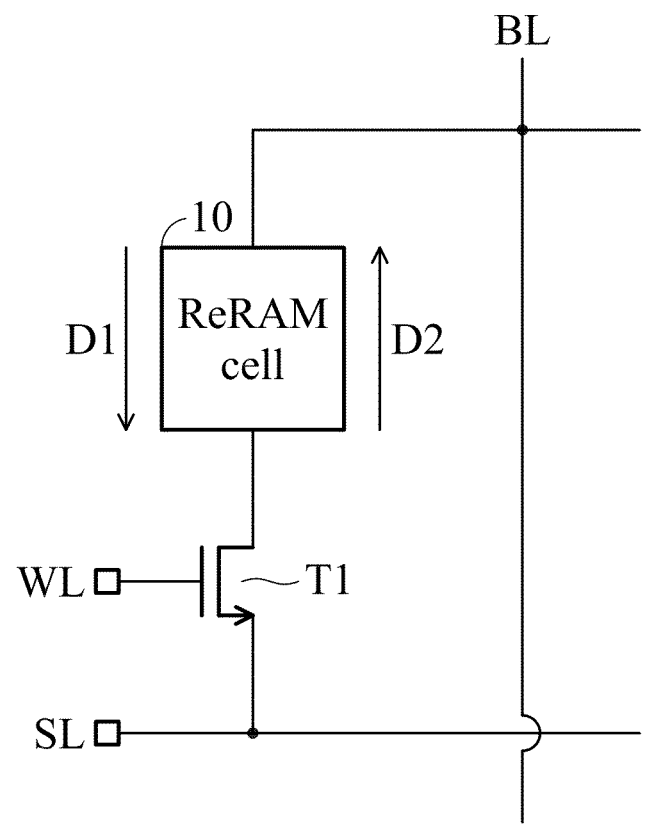
FIG. 1 is a schematic diagram of a resistance random access memory unit.

FIG. 1 is a schematic diagram of a resistance random access memory unit. The ReRAM memory unit 10 comprises a transistor T1 and a ReRAM cell 10. The ReRAM cell 10 is a resistive memory device and the resistance of the ReRAM cell 10 may be changed to accommodate different operations. This feature of having variable resistance is useful for storing data. The gate of the transistor T1 is connected to a word line WL, its source is connected to a source line SL, and its drain is connected to the ReRAM cell 10. When data in a first state is written to the ReRAM cell 10, the SET operation is executed and a voltage difference between the bit line BL and the source line SL is applied to the ReRAM cell 10 in a first direction D1. After the SET operation, the ReRAM cell 10 has a high resistance value. When data in a second state is written to the ReRAM cell 10, the RESET operation is executed and a voltage difference between the bit line BL and the source line SL is applied to the ReRAM cell 10 in a second direction D2. After the RESET operation, the ReRAM cell 10 has a low resistance value which is much lower than the high resistance value.

When logic "1" is written to the ReRAM cell 10, the SET operation is executed. When logic "0" is written to the ReRAM cell 10, the RESET operation is executed. In this embodiment, the ReRAM cell 10 stores data with two logic levels, but the invention is not limited thereto. The ReRAM cell 10 stores data with more than two logic levels according to the resistance range among the high resistance value corresponding to a SET operation and the low resistance value corresponding to a RESET operation.

Data stored in the ReRAM cell 10 can be read via a sense amplifier which is coupled to the bit line BL. The data is determined by sensing the current flowing through the bit line. The sensing current varies according to the resistance of the ReRAM cell 10. For example, when the ReRAM cell 10 is in a SET state, the resistance of the ReRAM cell 10 is relatively high, and the magnitude of the sensing current is relatively small. When the ReRAM cell 10 is in a RESET state, the resistance of the ReRAM cell 10 is relatively low, and the magnitude of the sensing current is relatively large. According to the phenomenon, the sense amplifier compares the sensing current with a reference current to read data stored in the ReRAM cell 10.

Figure 2D:
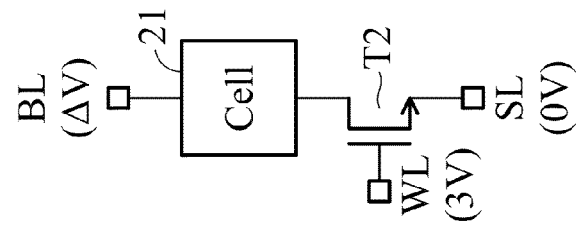
FIGS. 2A~2D show the voltage setting for ReRAM operations.
Figure 2C:
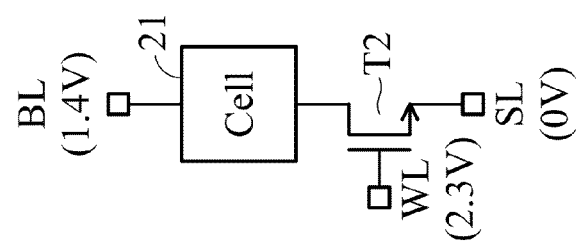
Figure 2B:
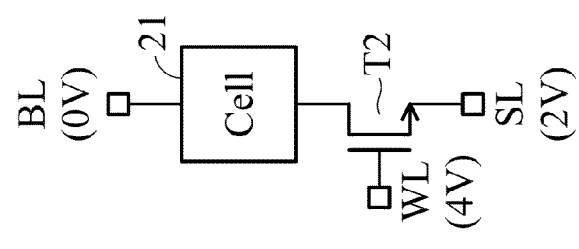
Figure 2A:
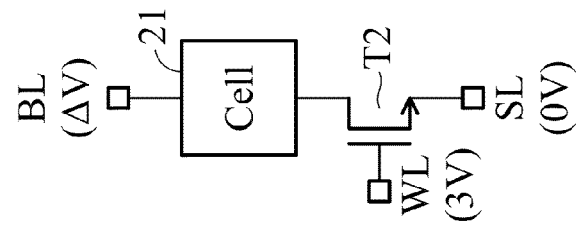

FIGS. 2A~2D show the voltage setting for ReRAM operations. FIG. 2A shows the voltage setting when the ReRAM is undergoing a forming operation. The ReRAM cell 21 is coupled between a bit line (BL) and a drain of the transistor T2. The gate of the transistor T2 is coupled to a word line (WL) and the source of the transistor T2 is coupled to a source line (SL). The forming operation is applied when the ReRAM cell 21 is only fabricated one time. The forming operation is implemented by applying a bias voltage to the ReRAM cell 21, such as the 3.8V on the bit line (BL), to induce soft breakdown on the oxide layer of the ReRAM cell 21. The soft breakdown increases the leakage current of the ReRAM cell 21. When the forming operation is executed, the voltage on the gate of the transistor T2 is pulled up to 2.3V.

When logic "0" data is written to the cell 21, the RESET operation is executed. The voltage setting for the RESET operation is shown in FIG. 2B. The bit line (BL) is grounded. The voltage on the word line (WL), coupled to the gate of the transistor T2, is pulled up to 4V, and the voltage on the source line (SL), coupled to the source of the transistor T2, is pulled up to 2V. When logic "1" data is written to the cell 21, the SET operation is executed. The voltage setting for the SET operation is shown in FIG. 2C. The bit line (BL) is pulled to 1.4V, the voltage on the word line (WL), coupled to the gate of the transistor T2, is pulled up to 2.3V, and the voltage on the source line (SL), coupled to the source of the transistor T2, is grounded.

When reading data stored in the cell 21, the voltage setting for the read operation is shown in FIG. 2D. The voltage on the source line (SL), coupled to the source of the transistor, T2 is grounded, the voltage on the word line (WL), coupled to the gate of the transistor T2, is pulled up to 3V, and the data is read by sensing the voltage on the bit line (BL).

According to the voltage setting for different operations described above, the voltage on the word line and bit line may be changed among 3 different voltage levels. For conventional memory array architecture, the control scheme has difficulty handling many different voltage levels.

Figure 3:
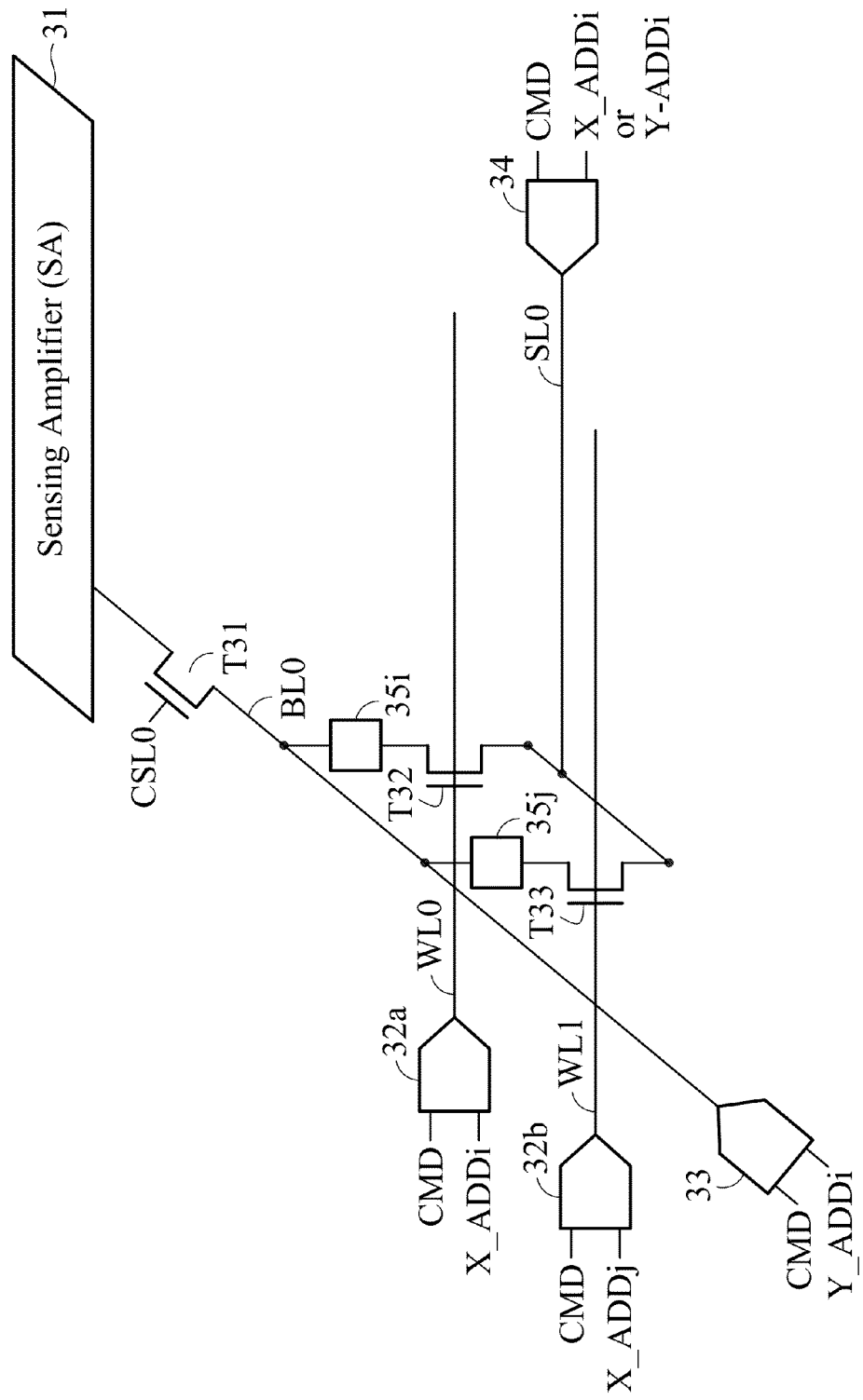
FIG. 3 is a schematic diagram of memory array architecture according to an embodiment of the invention.

FIG. 3 is a schematic diagram of memory array architecture according to an embodiment of the invention. In FIG. 3, only a portion of the memory array is disclosed. A person skilled in the art can complete the remaining portion of the memory array based on the disclosure and personal skill. The ReRAM memory cell (hereinafter abbreviated to memory cell) 35i is coupled to the sensing amplifier 31 via a transistor T31. The gate of the transistor T31 receives a column select signal CSL0, and when the transistor T31 is turned on, all memory cells coupled to the bit line BL0 are connected to the sensing amplifier 31. In one embodiment, the sensing amplifier 31 is only enabled when a read operation is applied to memory cells.

The memory cell 35i is coupled between the bit line BL0, which is driven by a bit line driver 33, and a drain of the transistor T32. The gate of the transistor T32 is coupled to a word line WL0 which is driven by a word line driver 32a. The source of the transistor T32 is coupled to a source line SL0 which is driven by a source driver 34. By using the word driver 32a, the bit line driver 33 and the source line driver 34, the memory cell 35i can be easily operated during the forming, SET, REST and read operations.

The world line driver 32a controls the voltage on the word line WL0 based on the command signal CMD and address signal X_ADDi. The signal CMD represents which operation has to be applied to the selected memory cell. The address signals X_ADDi and Y_ADDi are used to select a desired memory cell. The address signal X_ADDi means that the ith column of memory cells is selected and the address signal Y_ADDi means that the ith row of memory cells is selected. When the forming operation is applied to the memory cell 35i, the world line driver 32a outputs a voltage of 2.3V to the word line WL0 or pulls up the voltage of the word line WL0 to 2.3V. When the RESET operation is applied to the memory cell 35i, the world line driver 32a outputs a voltage of 4V to the word line WL0 or pulls up the voltage of the word line WL0 to 4V. When the SET operation is applied to the memory cell 35i, the world line driver 32a outputs a voltage of 2.3V to the word line WL0 or pulls up the voltage of the word line WL0 to 2.3V. When the read operation is applied to the memory cell 35i, the world line driver 32a outputs a voltage of 3V to the word line WL0 or pulls up the voltage of the word line WL0 to 3V.

The bit line driver 33 controls the voltage on the bit line BL0 according to the operation being applied to the memory cell. The bit line driver 33 receives the signal CMD and address signal Y_ADDi and outputs the corresponding voltage to the bit line BL0. When the forming operation is applied to the memory cell 35i, the bit line driver 33 outputs a voltage of 3.8V to the bit line BL0 or pulls up the voltage of the bit line BL0 to 3.8V. When the RESET operation is applied to the memory cell 35i, the bit line BL0 is grounded by the bit line driver 33. When the SET operation is applied to the memory cell 35i, the bit line driver 33 outputs a voltage of 1.4V to the bit line BL0 or pulls up the voltage of the bit line BL0 to 1.4V. When the read operation is applied to the memory cell 35i, the sensing amplifier 31 reads the voltage on the bit line BL0 to determine the data stored in the memory cell 35i, for example.

The source line driver 34 controls the voltage of the source line SL0 based on the received signal CMD and address signal Y_ADDi. In another embodiment, the address signal Y_ADDi is replaced by the address signal X_ADDi. When the RESET operation is applied to the memory cell 35i, the source line driver 34 outputs a voltage of 2V to the source line SL0 or pulls up the voltage of the source line SL0 to 2V. When the SET operation, read operation or forming operation is applied to the memory cell 35i, the source line SL0 is grounded by the source line driver 34.

According to the operation described in FIG. 3, the voltage settings for different operation applied on the ReRAM memory cell can be easily implemented by using the bit line drivers, word line drivers and source line drivers.

In one embodiment, the bit lines are divided into a plurality of bit line groups, the source lines comprise main source lines and sub source lines, and each sub source line is connected to different bit line group. In one embodiment, the address signal X_ADDi corresponds to a main source line and a sub source line. In another embodiment, the address signal X_ADDi corresponds to a main source line and an address signal Y_ADDi corresponds to a sub source line. In another embodiment, the word lines comprise main word lines and sub word lines, and each sub word line is connected to different bit line group, wherein the address signal X_ADDi corresponds to a main word line and a sub word line.

Figure 4:
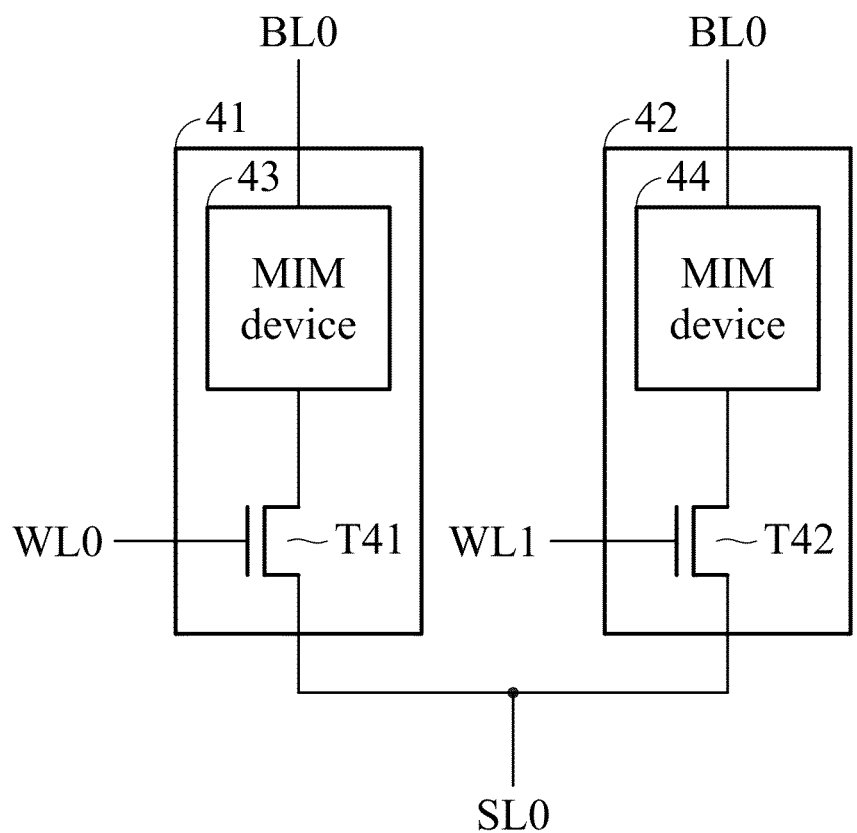
FIG. 4 is a schematic diagram of memory cells with a shared source line according to an embodiment of the invention.

In some embodiments, the definition of a memory cell does not include the switch, such as the transistor T2 shown in FIGS. 2A-2D. In some embodiments, the memory cell includes the switch. Please refer to FIG. 4. FIG. 4 is a schematic diagram of memory cells with a shared source line according to an embodiment of the invention. A first memory cell 41 and a second memory cell 42 are coupled to a bit line BL0 and a shared source line SL0. The first memory cell 41 is coupled to a word line WL0 and the second memory cell 42 is coupled to a word line WL1, wherein the shared source line is disposed between the word line WL0 and the word line WL1, for example. The first memory cell 41 includes a Metal-Insulator-Metal (MIM) device 43, for example, coupled to the bit line BL0. The MIM device 43 is also coupled to a transistor T41. The transistor T41 couples the MIM device 43 to the source line SL0 according to a control signal received via the word line WL0. In other embodiments, the MIM device can be replaced by a resistive memory device.

When logic "1" is written to the first memory cell 41, the SET operation is applied to the MIM device 43 and the resistance of the MIM device 43 is high. When logic "0" is written to the first memory cell 41, the RESET operation is applied to the MIM device 43, and the resistance of the MIM device 43 is relatively lower than the resistance of the MIM device 43 after the SET operation.

By using the shared source line, the size of the memory array can be reduced, and the number of source drivers can also be reduced.

In some situations, all the bit lines are pre-charged to 1.4V before a RESET operation, and only the selected bit line is driven to 0V. This means that the voltage level of other bit lines stays at 1.4V. This is a very big power burden for the ReRAM, and may be a major cause for the performance degradation in high-density ReRAM arrays.

Figure 5:
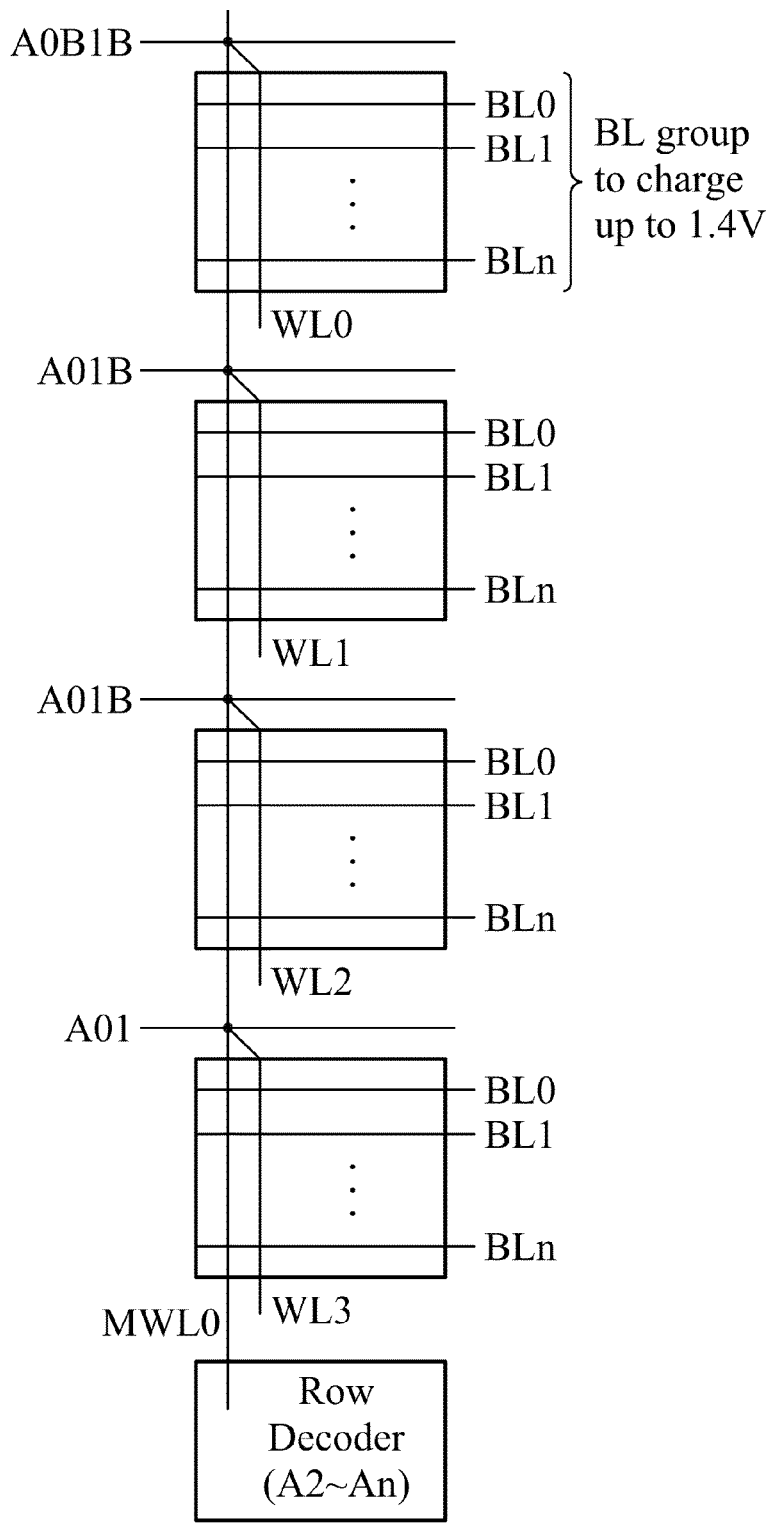
FIG. 5 is a schematic diagram showing a method of bit line grouping according to an embodiment of the invention.

FIG. 5 is a schematic diagram showing a method of bit line grouping according to an embodiment of the invention. In FIG. 5, the bit line grouping method is implemented according to the address signal X_ADD for the word line. In FIG. 5, the bit lines are divided into four groups according to the word line, and only the selected bit line group is charged to 1.4V. The voltage of the bit line belonging to an unselected bit line group stays at 0V.

Figure 6:
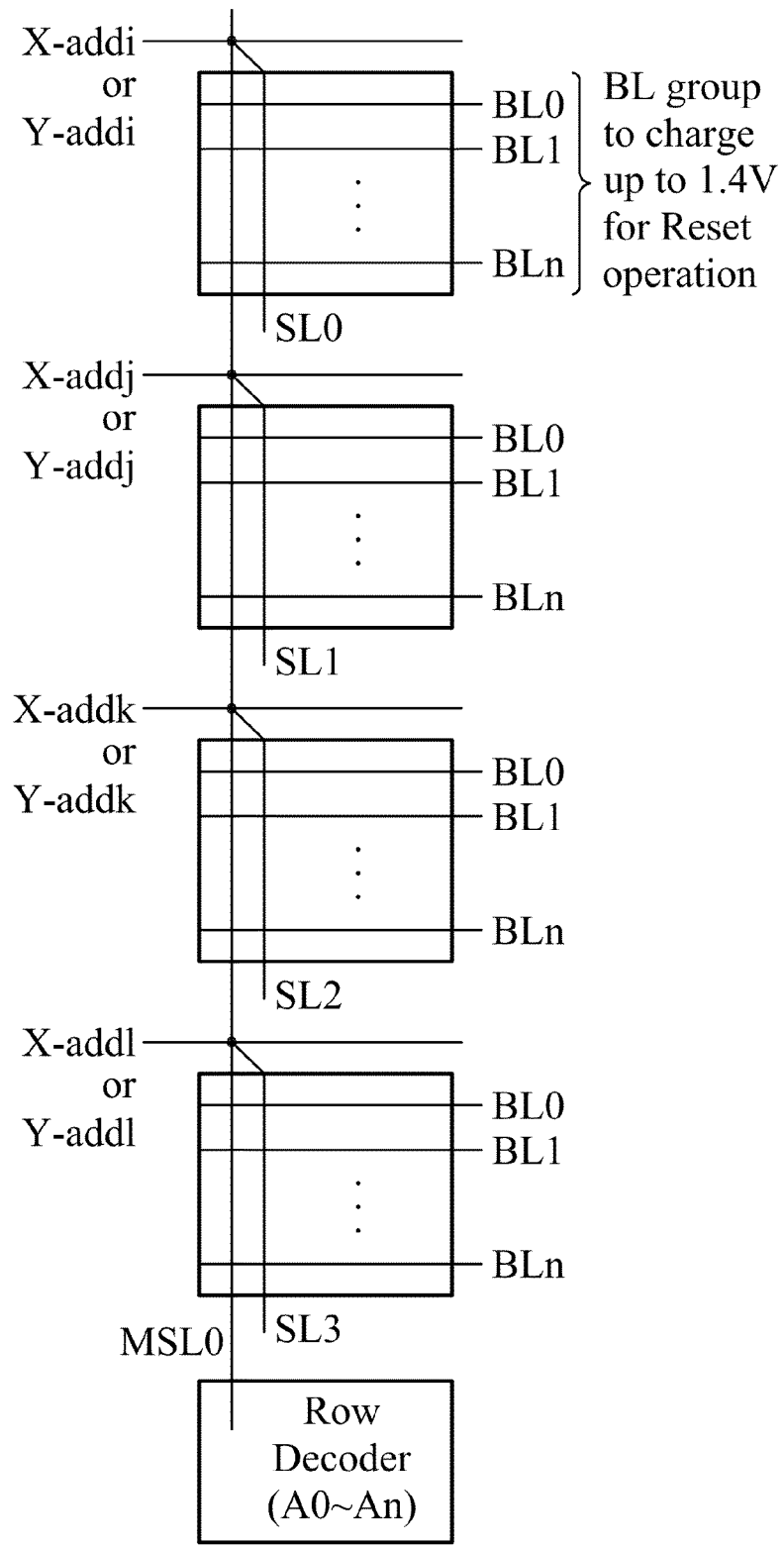
FIG. 6 is a schematic diagram showing a method of bit line grouping according to another embodiment of the invention.

FIG. 6 is a schematic diagram showing a method of bit line grouping according to another embodiment of the invention. In FIG. 6, the bit line grouping method is implemented according to the address signal X_ADD or the address signal Y_ADD for the source line. In FIG. 6, the bit lines are divided into four groups according to the source line, and only the selected bit line group is charged to 1.4V. The voltage of the bit line belonging to an unselected bit line group stays at 0V.

Figure 7:
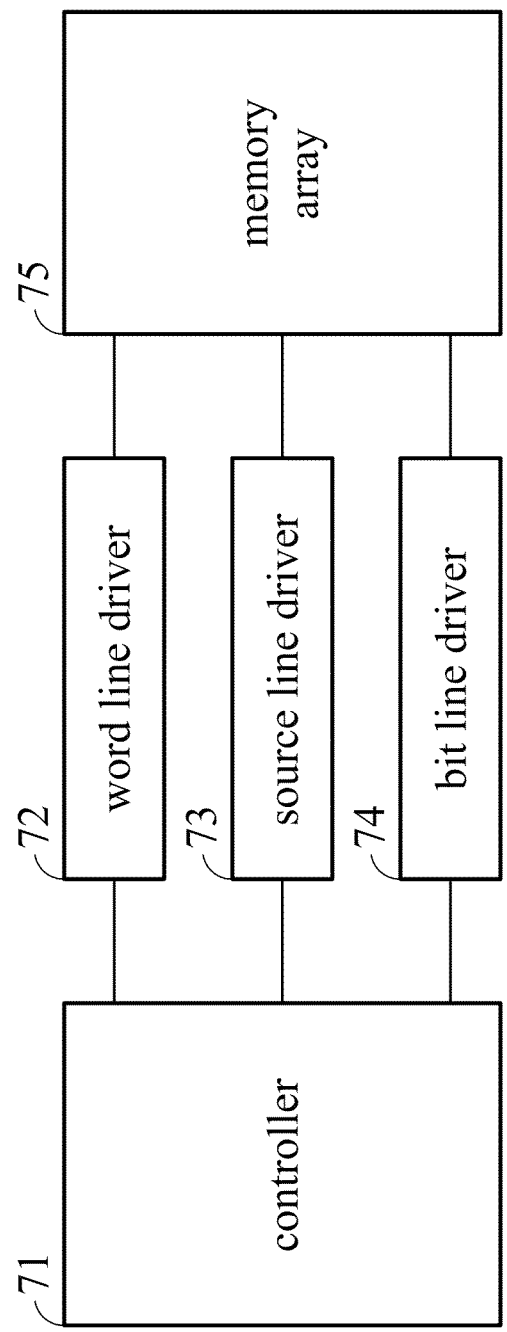
FIG. 7 is a schematic diagram of a ReRAM module according to an embodiment of the invention.

FIG. 7 is a schematic diagram of a ReRAM module according to an embodiment of the invention. The ReRAM module comprises a controller 71, a word line driver 72, a source line driver 73, a bit line driver 74 and a memory array 75. The controller 71 further comprises an address decoder to decode row addresses (Y-address) and column addresses (X-address). When one memory cell of the memory array 75 is selected and an operation, such as a RESET or SET operation, is applied to the selected memory cell, the controller 71 transmits a command signal and an address signal to the word line driver 72, the source line driver 73, and the bit line driver 74. The word line driver 72, the source line driver 73, and the bit line driver 74 output respective voltage to the word line, source line and bit line in response to the received command signal and address signal. Further details can be referred to in the descriptions of FIGS. 2A-2D and 3.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory, comprising:
a plurality of word lines;
a plurality of bit lines;
a memory cell array having a plurality of memory cells disposed at the intersections of the word and bit lines to form a matrix of rows and columns, wherein each memory cell comprises a resistive memory device and a transistor; and
a plurality of source lines each disposed between two word lines, wherein each source line is coupled to source terminals of the transistors, wherein each source line is driven by a source line driver, and the source line driver receives a command signal and an address signal, and pulls up the source line to the first voltage level according to the command signal and the address signal;
wherein when a RESET operation is applied to a selected memory cell, a voltage level of the source line is pulled up to a first voltage level, and when another operation is applied to the selected memory cell, the source line is grounded.

2. The memory as claimed in claim 1, wherein each word line is driven by a word line driver, and the word line driver receives the command signal and the address signal and controls a voltage level of the word line according to the command signal and the address signal.

3. The memory as claimed in claim 2, wherein the address signal comprises an X_ADD signal and a Y_ADD signal, the source line driver receives the Y_ADD signal and the word line driver receives the X_ADD signal.

4. The memory as claimed in claim 3, wherein the bit lines are divided into a plurality of bit line groups, the word lines comprise main word lines and sub word lines, each sub word line is connected to different bit line group.

5. The memory as claimed in claim 4, wherein the address signal comprises an X_ADD signals corresponding to a main word line and a sub word line.

6. The memory as claimed in claim 2, wherein the command signal represents a forming operation, a RESET operation, a SET operation or a read operation applied to the selected memory cell.

7. The memory as claimed in claim 2, wherein the word line driver controls the voltage level of the word line according to an operation applied to the selected memory cell and information about the operation is represented by the command signal.

8. The memory as claimed in claim 7, wherein when a forming operation or a SET operation is applied to the selected memory cell, the voltage level of the word line is changed to 2.3V by the word line driver; when the RESET operation is applied to the selected memory cell, the voltage level of the word line is changed to 4V by the word line driver; and when a read operation is applied to the selected memory cell, the voltage level of the word line is changed to 3V by the word line driver.

9. The memory as claimed in claim 1, wherein each bit line is driven by a bit line driver, and the bit line driver receives the command signal and the address signal and controls a voltage level of the bit line according to the command signal and the address signal.

10. The memory as claimed in claim 9, wherein the bit line driver controls the voltage level of the bit line according to an operation applied to the selected memory cell and information about the operation is represented by the command signal.

11. The memory as claimed in claim 10, wherein when a forming operation is applied to the selected memory cell, the voltage level of the bit line is changed to 3.8V by the bit line driver; when a RESET operation is applied to the selected memory cell, the bit line is grounded by the word line driver; and when a SET operation is applied to the selected memory cell, the voltage level of the bit line is changed to 1.4V by the bit line driver.

12. The memory as claimed in claim 1, wherein the bit lines are divided into a plurality of bit line groups, the source lines comprise main source lines and sub source lines, and each sub source line is connected to different bit line group.

13. The memory as claimed in claim 12, wherein the address signal comprises an X_ADD signals corresponding to a main source line and a sub source line.

14. The memory as claimed in claim 12, wherein the address signal comprises an X_ADD signals corresponding to a main source line and a Y_ADD corresponding to a sub source line.

15. A memory, comprising:
    a plurality of word lines;
    a plurality of bit lines;
    a memory cell array having a plurality of memory cells disposed at the intersections of the word and bit lines to form a matrix of rows and columns, wherein each memory cell comprises a resistive memory device and a transistor; and
    a plurality of source lines disposed in the memory cell array, wherein each source line is shared by two successive word lines, wherein each source line is driven by a source line driver, and the source line driver receives a command signal and an address signal, and pulls up the source line to the first voltage level according to the command signal and the address signal;
    wherein when a RESET operation is applied to a selected memory cell, a voltage level of the source line is pulled up to a first voltage level, and when another operation is applied to the selected memory cell, the source line is grounded.

16. The memory as claimed in claim 15, wherein each word line is driven by a word line driver, and the word line driver receives the command signal and the address signal and controls a voltage level of the word line according to the command signal and the address signal.

17. The memory as claimed in claim 16, wherein the command signal represents a forming operation, a RESET operation, a SET operation or a read operation applied to the selected memory cell.

18. The memory as claimed in claim 16, wherein the word line driver controls the voltage level of the word line according to an operation applied to the selected memory cell and information about the operation is represented by the command signal.

19. The memory as claimed in claim 18, wherein when a forming operation or a SET operation is applied to the selected memory cell, the voltage level of the word line is changed to 2.3V by the word line driver; when a RESET operation is applied to the selected memory cell, the voltage level of the word line is changed to 4V by the word line driver; and when a read operation is applied to the selected memory cell, the voltage level of the word line is changed to 3V by the word line driver.

20. The memory as claimed in claim 16, wherein the bit lines are divided into a plurality of bit line groups, the word lines comprise main word lines and sub word lines, each sub word line is connected to different bit line group.

21. The memory as claimed in claim 20, wherein the address signal comprises an X_ADD signals corresponding to a main word line and a sub word line.

22. The memory as claimed in claim 15, wherein the address signal comprises an X_ADD signal and a Y_ADD signal, the source line driver receives the Y_ADD signal and the word line driver receives the X_ADD signal.

23. The memory as claimed in claim 15, wherein each bit line is driven by a bit line driver, and the bit line driver receives the command signal and the address signal and controls a voltage level of the bit line according to the command signal and the address signal.

24. The memory as claimed in claim 23, wherein the bit line driver controls the voltage level of the bit line according to an operation applied to the selected memory cell and information about the operation is represented by the command signal.

25. The memory as claimed in claim 24, wherein when a forming operation is applied to the selected memory cell, the voltage level of the bit line is changed to 3.8V by the bit line driver; when a RESET operation is applied to the selected memory cell, the bit line is grounded by the word line driver; and when a SET operation is applied to the selected memory cell, the voltage level of the bit line is changed to 1.4V by the bit line driver.

26. The memory as claimed in claim 15, wherein the bit lines are divided into a plurality of bit line groups, the source lines comprise main source lines and sub source lines, and each sub source line is connected to different bit line group.

27. The memory as claimed in claim 26, wherein the address signal comprises an X_ADD signals corresponding to a main source line and a sub source line.

28. The memory as claimed in claim 26, wherein the address signal comprises an X_ADD signals corresponding to a main source line and a Y_ADD corresponding to a sub source line.

* * * * *